(12) United States Patent
Okada

(10) Patent No.: US 6,596,622 B2
(45) Date of Patent: Jul. 22, 2003

(54) SEMICONDUCTOR DEVICE HAVING A MULTI-LAYER PAD AND MANUFACTURING METHOD THEREOF

(75) Inventor: Masakazu Okada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/976,114

(22) Filed: Oct. 15, 2001

(65) Prior Publication Data

US 2002/0155719 A1 Oct. 24, 2002

(30) Foreign Application Priority Data

Apr. 24, 2001 (JP) ......................................... 2001-126648

(51) Int. Cl.[7] .............................................. H01L 21/44
(52) U.S. Cl. ...................... 438/617; 438/455; 438/675; 438/692
(58) Field of Search .......................... 257/774; 438/618, 438/672, 629, 675, 692, 637, 639, 455, 612, 617

(56) References Cited

U.S. PATENT DOCUMENTS

| | | | | |
|---|---|---|---|---|
| 5,767,005 A | * | 6/1998 | Doan et al. ................ | 438/593 |
| 5,903,054 A | * | 5/1999 | Sardella ..................... | 257/751 |
| 5,948,698 A | * | 9/1999 | Inohara et al. ............. | 438/691 |
| 5,981,378 A | * | 11/1999 | Bothra ....................... | 438/637 |
| 6,011,311 A | * | 1/2000 | Hsing et al. ............... | 257/774 |
| 6,045,435 A | * | 4/2000 | Bajaj et al. ................ | 451/41 |
| 6,060,370 A | * | 5/2000 | Hsia et al. ................. | 438/424 |
| 6,069,071 A | * | 5/2000 | Hasunuma et al. ........ | 438/637 |
| 6,075,293 A | * | 6/2000 | Li et al. .................... | 257/763 |
| 6,077,782 A | * | 6/2000 | Hsu et al. .................. | 438/688 |
| 6,103,625 A | * | 8/2000 | Marcyk et al. ............ | 438/691 |
| 6,156,639 A | * | 12/2000 | Fukao et al. ............... | 438/629 |
| 6,184,143 B1 | * | 2/2001 | Ohashi et al. ............. | 438/697 |
| 6,218,302 B1 | * | 4/2001 | Braeckelmann et al. ... | 438/637 |
| 6,225,211 B1 | * | 5/2001 | Tsui ........................... | 438/624 |
| 6,274,516 B1 | * | 8/2001 | Kamei et al. .............. | 438/769 |
| 6,291,891 B1 | * | 9/2001 | Higashi et al. ............ | 257/750 |
| 6,313,537 B1 | * | 11/2001 | Lee et al. ................... | 257/680 |
| 6,319,731 B1 | * | 11/2001 | Kang et al. ................ | 438/3 |
| 6,342,444 B1 | * | 1/2002 | Higashi et al. ............ | 438/627 |
| 6,350,642 B1 | * | 2/2002 | Lee et al. ................... | 438/238 |
| 6,376,353 B1 | * | 4/2002 | Zhou et al. ................ | 438/612 |
| 6,376,362 B1 | * | 4/2002 | Matsumoto ................ | 438/612 |
| 6,424,036 B1 | * | 7/2002 | Okada ....................... | 257/508 |

FOREIGN PATENT DOCUMENTS

JP           10-22386           1/1998

OTHER PUBLICATIONS

US 2002/005624 A1; United States Patent Application Publication; Aoyagi et al.*
US 2002/0011671 A1; United States Patent Application Publication; Shimizu.*
US 2002/0037643 A1; United States Patent Application Publication; Ishimaru.*

* cited by examiner

*Primary Examiner*—Olik Chaudhuri
*Assistant Examiner*—Fernando Toledo
(74) *Attorney, Agent, or Firm*—McDermott, Will & Emery

(57) ABSTRACT

In the semiconductor device manufactured by the manufacturing method of the present invention, the tungsten layer resistant to an impulsive force is formed without the oxide film layer existing below the second pad. Hence, if an external force is applied to the second pad through an opening upon bonding or the like, cracks are hard to occur. Accordingly, it is possible to provide a semiconductor device high in mechanical strength and reliability and a method of manufacturing.

14 Claims, 8 Drawing Sheets

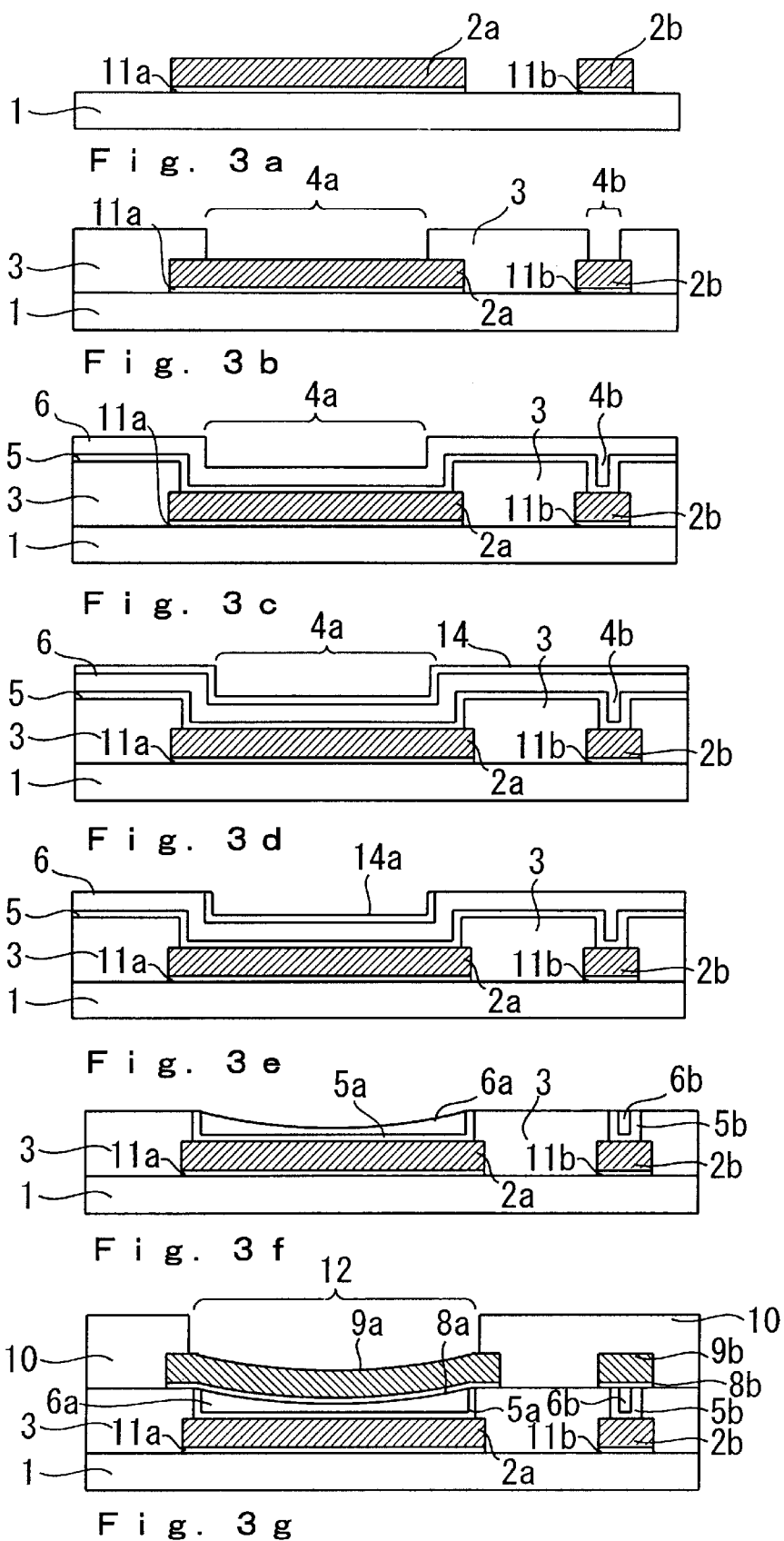

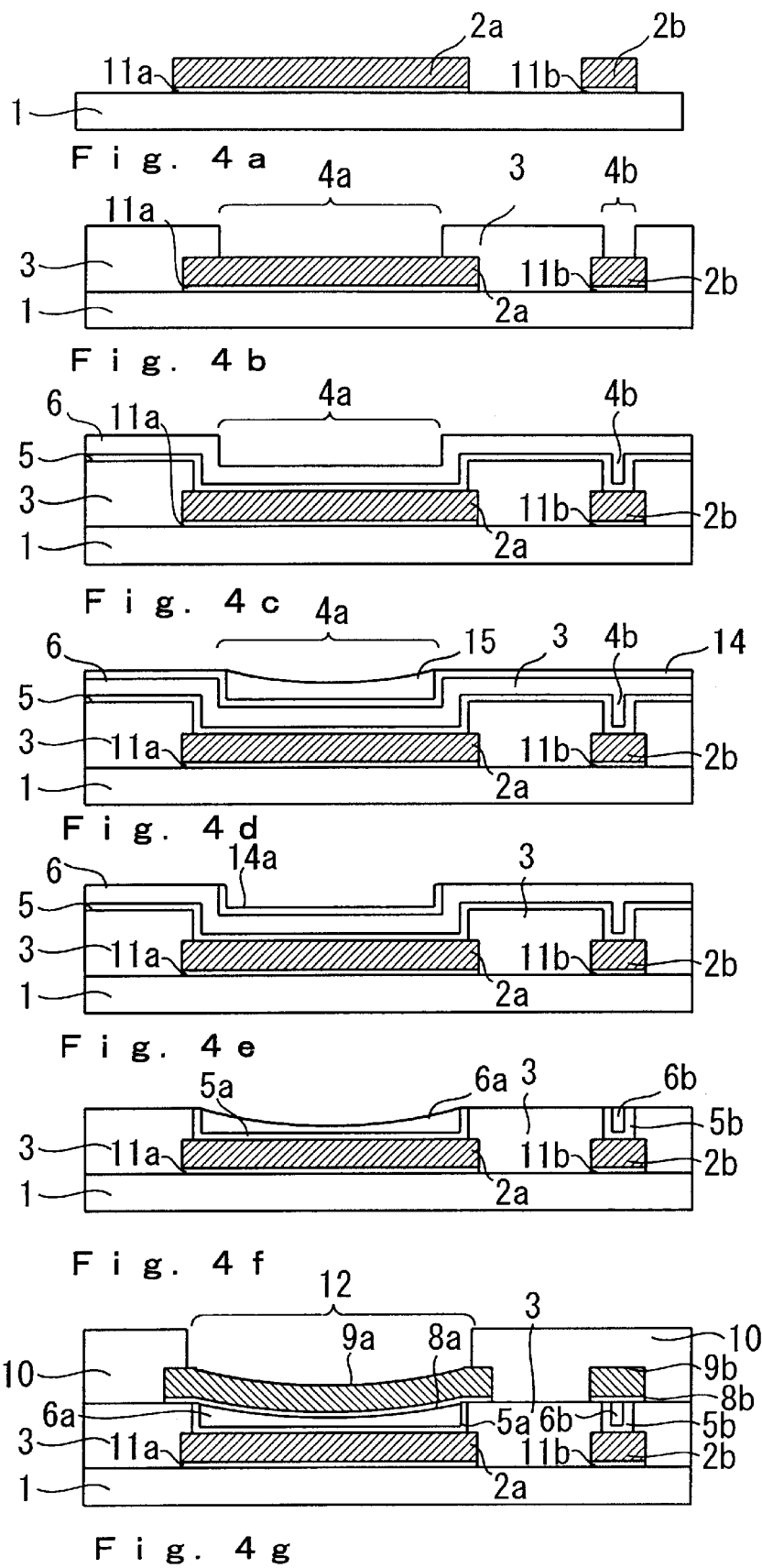

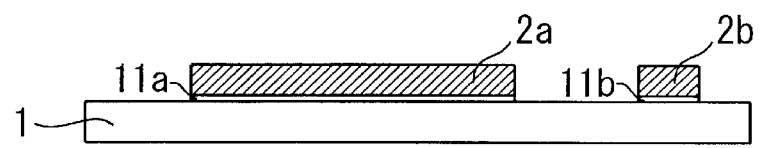
Fig. 5a
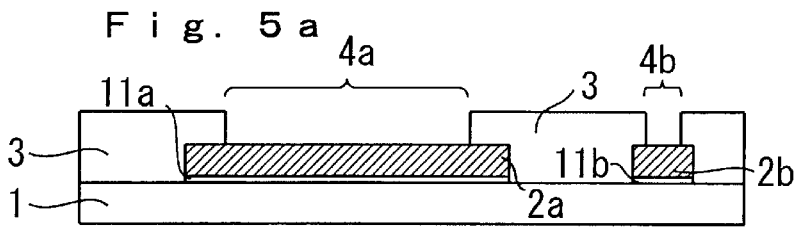
Fig. 5b
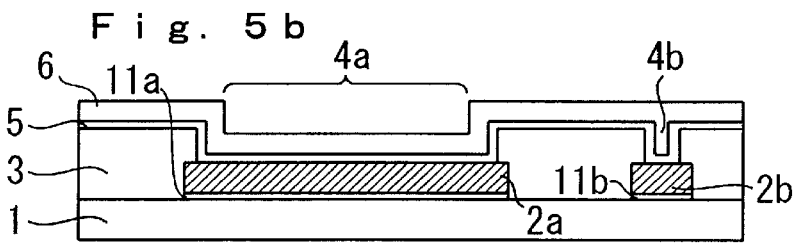
Fig. 5c
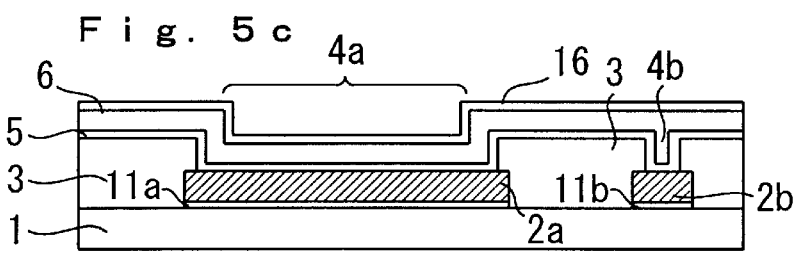
Fig. 5d
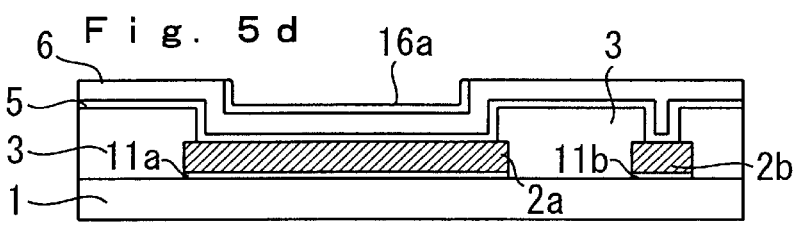
Fig. 5e
Fig. 5f
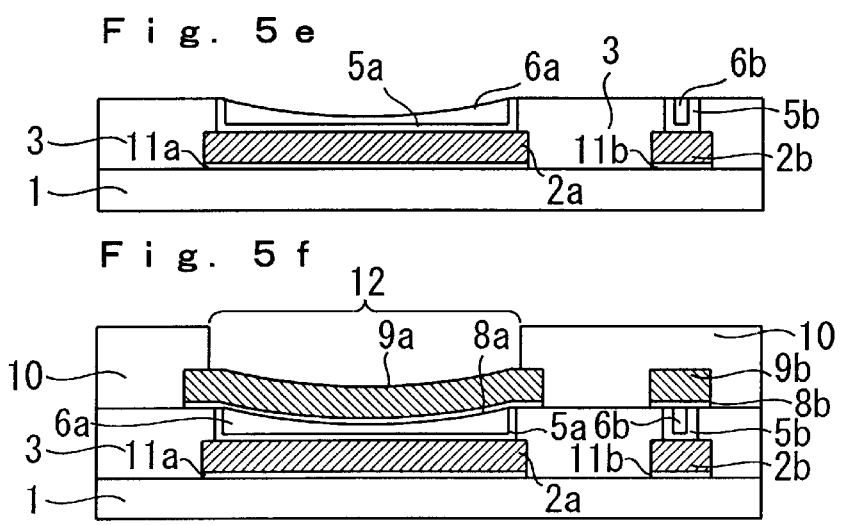
Fig. 5g

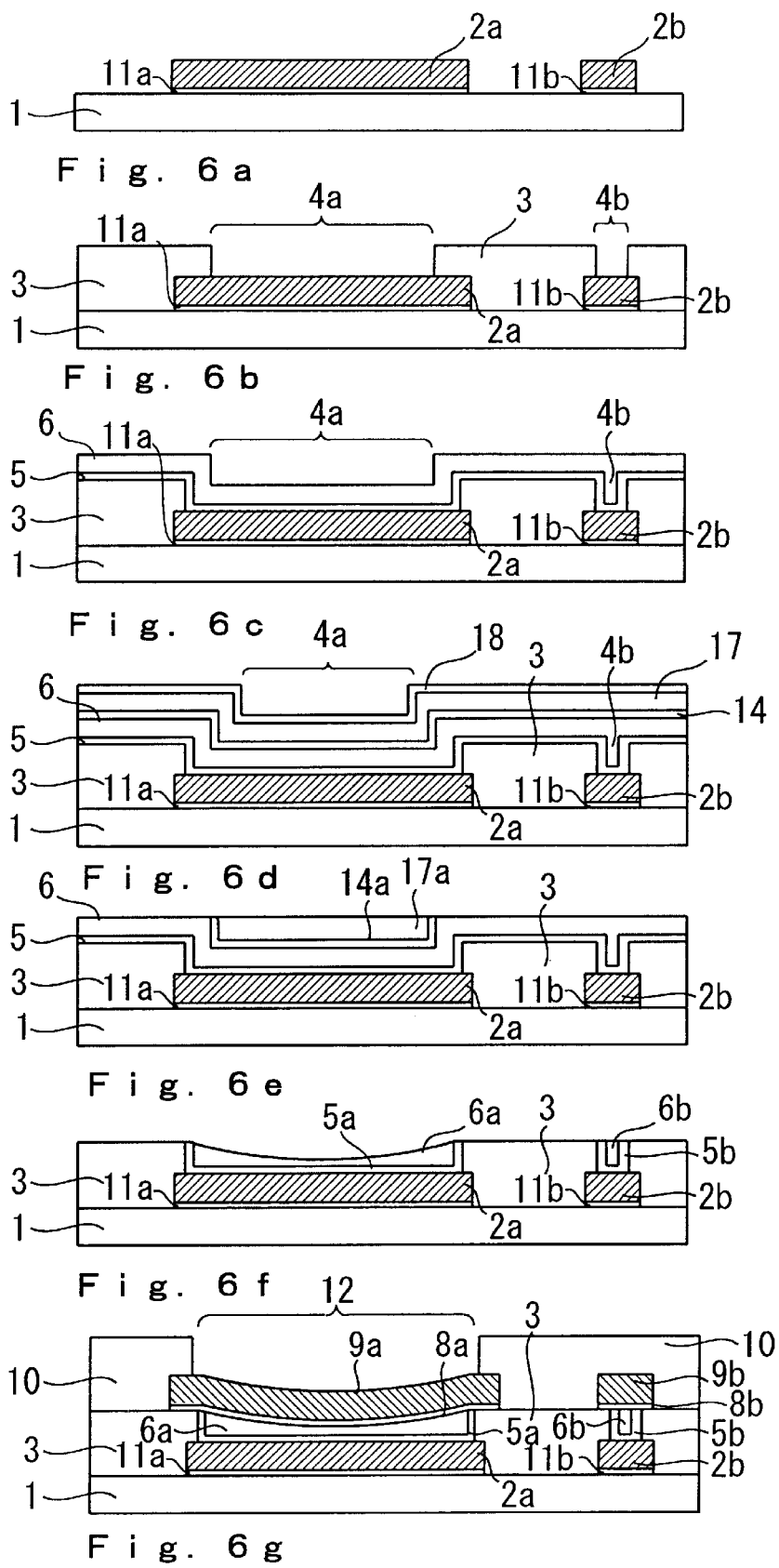

SEMICONDUCTOR DEVICE HAVING A MULTI-LAYER PAD AND MANUFACTURING METHOD THEREOF

BACKGROUND OF THE INVENTION

1. Field of the Invention

The present invention relates to a semiconductor device and a method of manufacturing it, and particularly to a semiconductor device having a multilayer pad formed by using tungsten CMP and a method of manufacturing it.

2. Background Art

A method of manufacturing a semiconductor device having a conventional multilayer pad structure will be explained with reference to FIG. 8. FIGS. 8a through 8e are respectively schematic cross-sectional views showing a semiconductor device in respective process steps of the conventional manufacturing method of the semiconductor device. Incidentally, the same drawings respectively show via holes in addition to pad portions.

As shown in FIG. 8a, a lower barrier metal layer is first formed over a base substrate 1 with an interlayer film laminated over an Si substrate by a sputtering method. Further, a first Al layer is formed over the lower barrier metal layer by the sputtering method. Thereafter, RIE etching is carried out. Consequently, a first pad 2a, a first wiring 2b and lower barrier metal layers 11a and 11b corresponding to them are formed.

Next, as shown in the same FIG. 8b, an oxide film layer 3 used as an insulating film layer is formed over the first pad 2a and the first wiring 2b, followed by execution of photo-engraving and RIE etching. Thus, a plurality of openings 4c defined so as to partly open the surface of the first pad 2a, and a via hole 4b defined so as to partly open the surface of the first wiring 2b are formed. Here, the plurality of openings 4c and a plurality of oxide film layers 3a are formed over the surface of the first pad 2a. The open area of each opening 4c is approximately equal to that of the via hole 4b.

Next, as shown in the same FIG. 8c, a first barrier metal layer 5 is formed over the oxide film layer 3 by the sputtering method. A tungsten layer 6 used as a plug layer is formed over the first barrier metal layer 5 by a CVD method. Here, the first barrier metal layer 5 is laminated along hole shapes of the plurality of openings 4c and the via hole 4b, and the surface thereof is brought into concavo-convex forms. On the other hand, the tungsten layer 6 is laminated without extending along the hole shapes of the plurality of openings 4c and the via hole 4b, and the surface thereof is brought into planar form.

Next, the tungsten layers 6a and 6b and the first barrier metal layers 5a and 5b in the plurality of openings 4c and the via hole 4b are left behind as shown in the same FIG. 8d. Further, other tungsten layer 6, first barrier metal layer 5 and parts of oxide film layer 3 are removed by tungsten CMP. Afterwards, HF processing is done to prevent metal contamination.

Finally, as shown in the same FIG. 8e, a second barrier metal layer and a second Al layer are sequentially formed over the oxide film layer 3 by the sputtering method. Further, desired second barrier metal layers 8a and 8b, second pad 9a and second wiring 9b are formed by RIE etching. Furthermore, a P-SiN layer 10 is formed over the second pad 9a and the second wiring 9b by the CVD method. An opening 12 is defined in the P-SiN layer 10 so as to open the surface of the second pad 9a.

In the semiconductor device manufactured in the above-described process steps, wires and the like are thereafter bonded onto the surface of the second pad 9a through the opening 12.

In the semiconductor device manufactured by the aforementioned conventional manufacturing method, cracks were produced in the oxide film layers 3a below the second pad 9a when the wire bonding was effected on the surface of the second pad 9a through the opening 12. Namely, an external force (distributed load) corresponding to the bonding is instantaneously applied to the surface of the second pad 9a. While the second pad 9a is formed of Al having shock absorbency, it cannot accommodate its impactive force because its thickness is extremely thin. Therefore, the impactive force is applied even to the surfaces of the oxide film layers 3a and tungsten layers 6a placed below the second pad 9a. Since the oxide film layers 3a formed of $SiO_2$ or the like are low in ultimate strength as compared with the tungsten layers 6a, the cracks are produced in the oxide film layers 3a. Thus, when the cracks occur in the oxide film layers 3a, a secondary problem arises in that interlayer withstand pressure and reliability for temperatures are deteriorated.

In order to solve the aforementioned problems, only the tungsten layers 6a are considered to be formed between the first pad 2a and the second pad 9a without forming the oxide film layers 3a. In such a case, however, there is the fear of the occurrence of erosion in the first pad 2a by CMP.

Namely, the formation of only the tungsten layers 6a over the first pad 2a needs to form openings large in open area over the first pad 2a in advance, thereafter form tungsten layers and leave the tungsten layers only in the opening by CMP.

However, the tungsten layers each formed in the opening large in open area are polished in concave form by CMP. Namely, since a polishing rate per unit time with respect to tungsten is larger than a polishing rate per unit time with respect to a barrier metal, the tungsten layers formed in the openings placed in positions lower than the barrier metal layers would also be polished when the polishing of the barrier metal layers are brought to completion. Thus, the tungsten layers formed in the openings are polished in concave form. When the degree thereof increases, the polishing reaches up to the first pad, so-called erosion occurs.

Further, there is fear that when the erosion occurs in this way, the following two secondary problems will arise. One of the problems is that due to post-CMP HF processing (isotropic etching), the first pad corrodes, and a hollow portion is defined in the first pad, whereby reliability for temperatures is deteriorated. Another problem is that an external force produced by the aforementioned bonding, and an external force developed by contact of a test pin used upon a wafer inspection are applied to the first pad to thereby produce cracks in the base substrate below the first pad made thinly by polishing, whereby interlayer withstand pressure and reliability for temperatures are deteriorated.

SUMMARY OF THE INVENTION

The present invention has been made to solve the aforementioned problems. Therefore, the present invention aims to provide a semiconductor device which produces no cracks in an oxide film layer and a base substrate or the like even if an external force is applied to a pad portion, and which is free of the occurrence of erosion by tungsten CMP, and a manufacturing method thereof.

According to one aspect of the present invention, in a method of manufacturing a semiconductor device, a first pad is formed over a base substrate. An insulating film layer is formed over the first pad and thereafter a concave pad opening is defined in the insulating film layer so as to expose nearly the whole area of the surface of the first pad. A first barrier metal layer is formed over the first pad and the insulating film layer so as to extend along the concave shape of the pad opening. A plug layer is formed over the first barrier metal layer. The plug layer and the first barrier metal layer are CMP-polished to thereby expose the insulating film layer and leave the plug layer in the pad opening. A second barrier metal layer is formed over the plug layer. A second pad is formed over the second barrier metal layer.

Other and further objects, features and advantages of the invention will appear more fully from the following description.

BRIEF DESCRIPTION OF THE DRAWINGS

FIG. 3 is a schematic cross-sectional view depicting a semiconductor device in respective process steps of a method of manufacturing the semiconductor device, showing a third embodiment of the present invention;

FIG. 4 is a schematic cross-sectional view showing a semiconductor device in respective process steps of a method of manufacturing the semiconductor device, showing a fourth embodiment of the present invention;

FIG. 5 is a schematic cross-sectional view illustrating a semiconductor device in respective process steps of a method of manufacturing the semiconductor device, showing a fifth embodiment of the present invention;

FIG. 6 is a schematic cross-sectional view depicting a semiconductor device in respective process steps of a method of manufacturing the semiconductor device, showing a sixth embodiment of the present invention;

DETAILED DESCRIPTION OF THE PREFERRED EMBODIMENTS

First Embodiment

A first embodiment of the present invention will be described below in detail with reference to the accompanying drawings. FIGS. 1a through 1e are respectively schematic cross-sectional views showing a semiconductor device in respective process steps in a method of manufacturing the semiconductor device, showing the first embodiment of the present invention.

Figure 1A:
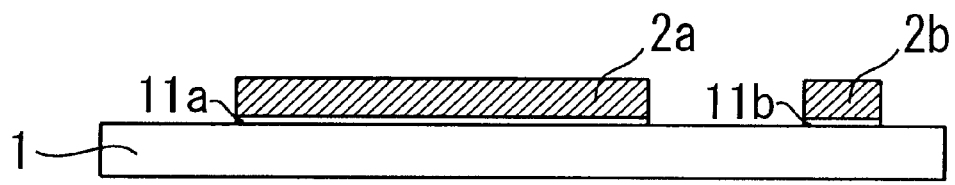
FIG. 1 is a schematic cross-sectional view showing a semiconductor device in respective process steps of a method of manufacturing the semiconductor device, showing a first embodiment of the present invention.

As shown in FIG. 1a, a lower barrier metal layer is first formed over a base substrate 1 with an interlayer film laminated over an Si substrate by a sputtering method. Further, a first Al layer is formed over the lower barrier metal layer by the sputtering method. Thereafter, RIE etching is carried out to thereby form a first pad 2a, a first wiring 2b and lower barrier metal layers 11a and 11b corresponding to them. Here, the lower barrier metal layers 11a and 11b are respectively formed of TiN/Ti or TiO/Ti, for example. Further, the first pad 2a and the first wiring 2b are respectively formed of Al having a thickness of about 4000 Å, for example.

Figure 1B:
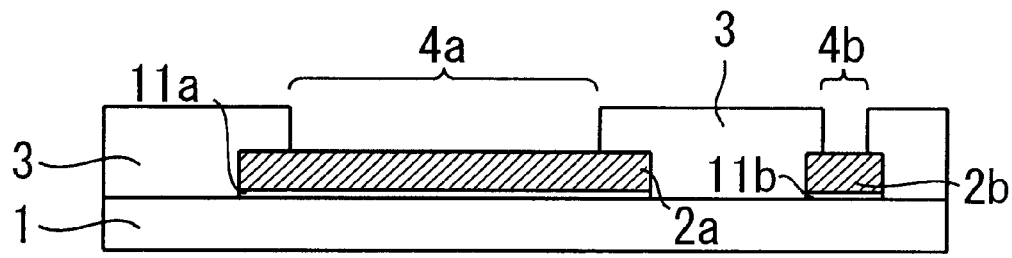

Next, as shown in the same FIG. 1b, an oxide film layer 3 used as an insulating film layer is formed over the first pad 2a and the first wiring 2b, followed by execution of photoengraving and RIE etching. Thus, a pad opening 4a is defined in the surface of the first pad 2a, and a via hole 4b is defined in the surface of the first wiring 2b. Here, the pad opening 4a is made open so as to be exposed substantially over the whole area while an outer peripheral portion of the surface of the first pad 2a is left behind. Namely, the pad opening 4a is formed as a single opening and no oxide film layer 3 exists within its region.

Figure 1C:
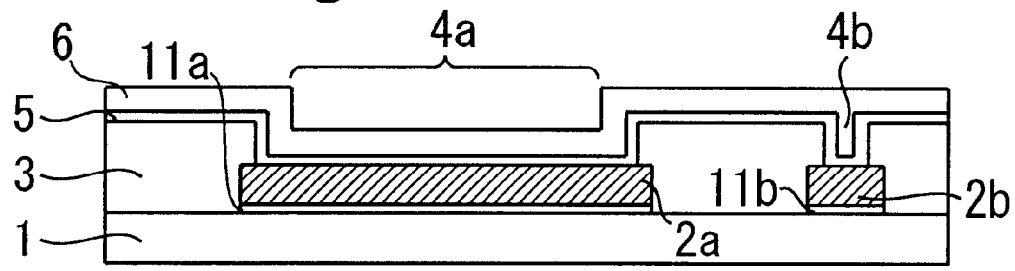

Next, as shown in the same FIG. 1c, a first barrier metal layer 5 is formed over the oxide film layer 3 by the sputtering method. A tungsten layer 6 used as a plug layer is further formed over the first barrier metal layer 5 by a CVD method. Here, the first barrier metal layer 5 is laminated along hole shapes of the pad opening 4a and the via hole 4b, and the surface thereof is brought into concavo-convex forms. On the other hand, the tungsten layer 6 is laminated in concave form along the shape of the pad opening 4a. Further, the tungsten layer 6 is laminated in planar form without extending along the hole shape of the via hole 4b.

Figure 1D:
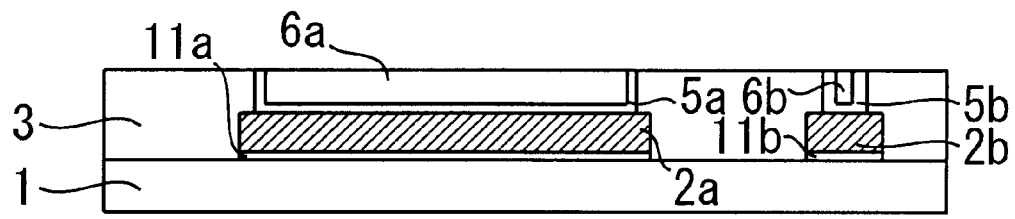

Next, the tungsten layers 6a and 6b and the first barrier metal layers 5a and 5b in the pad opening 4a and the via hole 4b are left behind as shown in the same FIG. 1d. Further, other tungsten layer 6, first barrier metal layer 5 and parts of oxide film layer 3 are removed by tungsten CMP. Afterwards, HF processing is done to prevent metal contamination.

Figure 1E:
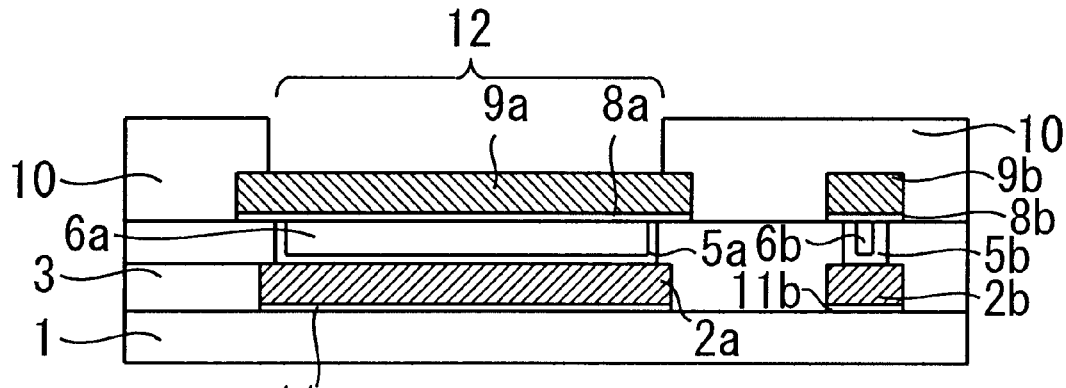

Finally, as shown in the same FIG. 1e, a second barrier metal layer and a second Al layer are sequentially formed over the oxide film layer 3 by the sputtering method. Further, desired second barrier metal layers 8a and 8b, second pad 9a and second wiring 9b are formed by RIE etching. Furthermore, a P-SiN layer 10 is formed over the second pad 9a and the second wiring 9b by the CVD method. An opening 12 is defined in the P-SiN layer 10 so as to open the surface of the second pad 9a. Here, the second barrier metal layers 8a and 8b are respectively formed of TiN/Ti or TiO/Ti, for example. Here, the second pad 9a and the second wiring 9b are respectively formed of Al having a thickness of about 6000 Å, for example. In the semiconductor device manufactured in the above-described process steps, wires and the like are thereafter bonded onto the surface of the second pad 9a through the opening 12.

In the semiconductor device manufactured by the manufacturing method shown in the first embodiment as described above, since the tungsten layer 6a resistant to an impulsive force is formed without the oxide film layer 3 existing below the second pad 9a even if an external force is applied to the second pad 9a through the opening 12 upon bonding or the like, cracks are hard to occur. Accordingly, a semiconductor device high in mechanical strength and reliability and a method of manufacturing it can be provided.

Since there is no insulating oxide film layer 3 between the first pad 2a and the second pad 9a, electrical resistance between the two can be reduced, and the size of a chip can be scaled down. Namely, when the resistance between the pads is set to the same value as that employed in the conventional semiconductor device, the area of each pad can be reduced by a portion excluding the oxide film layer 3.

Incidentally, while the semiconductor device having the two-layer pad structure wherein the second pad 9a is laminated above the first pad 2a, is used in the present embodiment, the present invention can be applied even if a semiconductor device having a multilayer pad structure wherein pads more than them are further laminated thereon, is used. In such a case, an effect similar to the first embodiment can be brought about.

Second Embodiment

A second embodiment of the present invention will be explained below in detail with reference to the accompanying drawings. FIGS. 2a through 2e are respectively schematic cross-sectional views showing a semiconductor device in respective process steps in a method of manufacturing the semiconductor device, according to the second embodiment of the present invention. The second embodiment is one wherein a first pad 2a and a second pad 9a are formed on a large scale as compared with the first embodiment. The sizes of the first pad 2a and the second pad 9a illustrated in both embodiments are shown equally for the sake of simplicity.

Figure 2A:
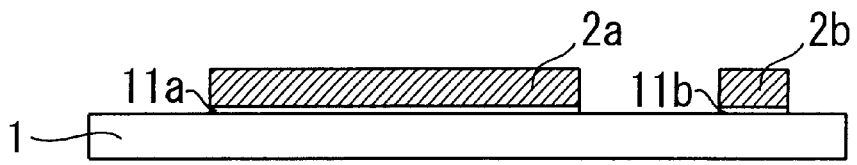
FIG. 2 is a schematic cross-sectional view illustrating a semiconductor device in respective process steps of a method of manufacturing the semiconductor device, showing a second embodiment of the present invention.
Figure 2B:
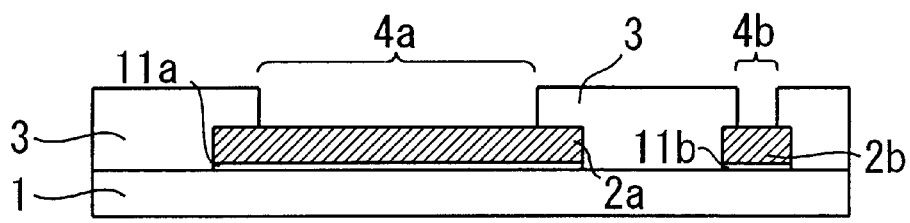
Figure 2C:
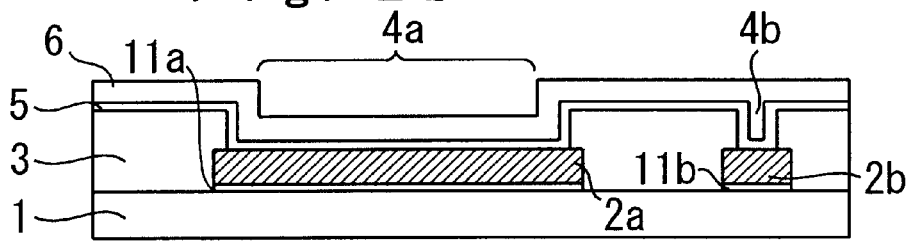

In FIGS. 2a through 2c, process steps similar to FIGS. 1a through 1c of the aforementioned first embodiment are performed.

Figure 2D:
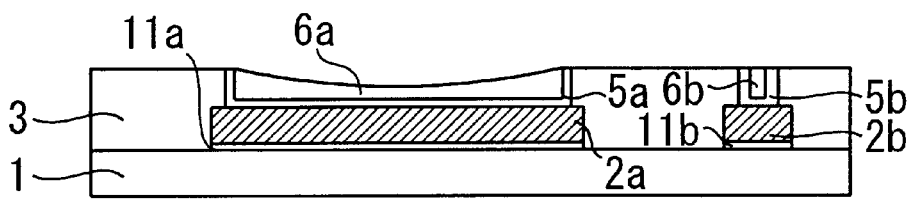

Thereafter, tungsten layers 6a and 6b and first barrier metal layers 5a and 5b in a pad opening 4a and a via hole 4b are left behind as shown in FIG. 2d. Further, other tungsten layer 6, first barrier metal layer 5 and parts of oxide film layer 3 are removed by tungsten CMP. At this time, the tungsten layer 6a left in the pad opening 4a is polished in concave form due to the difference in rate between the aforementioned tungsten and barrier metal. Namely, since the open area of the pad opening 4a employed in the second embodiment becomes larger than that of the pad opening 4a employed in the first embodiment, it is susceptible to the above-described rate.

Figure 2E:
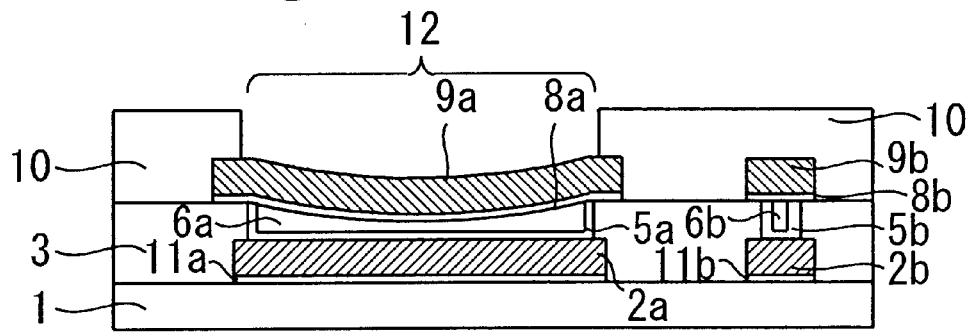

Finally, as shown in the same FIG. 2e, a second barrier metal layer and a second Al layer are sequentially formed over the oxide film layer 3 by a sputtering method. At this time, the second barrier metal layer and the second Al layer are laminated, in concave form, over the tungsten layer 6a formed in concave form so as to extend along the shape of the tungsten layer 6a.

Thereafter, second barrier metal layers 8a and 8b, a second pad 9a and a second wiring 9b are formed by RIE etching. Further, a P-SiN layer 10 is formed over the second pad 9a and the second wiring 9b by a CVD method. An opening 12 is defined in the P-SiN layer 10 so as to open the concave surface of the second pad 9a.

In the semiconductor device manufactured in the above-described process steps, wires and the like are thereafter bonded onto the concave surface of the second pad 9a through the opening 12. When the relatively large second pad 9a is formed as in the second embodiment, pad bonding is carried out by a jig having a convex surface in accordance with the concave surface of the second pad 9a.

In the semiconductor device manufactured by the manufacturing method shown in the second embodiment as described above, when the second pad 9a is subjected to bonding, such a distributed load as to exist along the concave surface shape is applied onto the second pad 9a. Accordingly, a stress that the tungsten layer 6a placed therebelow undergoes, is reduced, and cracks become hard to occur in the tungsten layer 6a. It is thus possible to provide a semiconductor device high in mechanical strength and reliability and a manufacturing method thereof.

Third Embodiment

A third embodiment of the present invention will be explained below in detail with reference to the accompanying drawings. FIGS. 3a through 3g are respectively schematic cross-sectional views showing a semiconductor device in respective process steps in a method of manufacturing the semiconductor device, according to the third embodiment of the present invention. Incidentally, the third embodiment includes a relatively large first pad 2a and second pad 9a formed in a manner similar to the second embodiment.

In FIGS. 3a through 3c, process steps similar to FIGS. 2a through 2c of the aforementioned second embodiment are performed.

Thereafter, as shown in FIG. 3d, a third barrier metal layer 14 is formed over a tungsten layer 6 by a sputtering method. Here, the third barrier metal layer 14 is laminated within a pad opening 4a along its concave shape.

Next, as shown in the same FIG. 3e, other third barrier metal layer 14 is removed by CMP so that the third barrier metal layer 14a lying within the pad opening 4a is left behind. Here, the third barrier metal layer 14 is formed of TiN/Ti or TiO/Ti, for example. These barrier metals have the properties that they are mechanically polished. Namely, a concave portion is hard to be polished as compared with a protruding portion. As described above, the third barrier metal layer 14a remains in the pad opening 4a.

Further, as shown in the same FIG. 3f, the aforementioned CMP is continuously executed to leave behind tungsten layers 6a and 6b and first barrier metal layers 5a and 5b lying within the pad opening 4a and a via hole 4b and remove other tungsten layer 6 and first barrier metal layer 5 and part of an oxide film layer 3.

At this time, the tungsten layer 6a left in the pad opening 4a is polished in slow concave form under the influence of the third barrier metal layer 14a left in the pad opening 4a. Namely, since the third barrier metal layer 14a left in the pad opening 4a is polished prior to the polishing of the tungsten layer 6a in the pad opening 4a in the advanced process of CMP, the amount of polishing of the tungsten layer 6a in the pad opening 4a is reduced correspondingly.

Finally, as shown in the same FIG. 3g, a second barrier metal layer and a second Al layer are successively formed over the oxide film layer 3 by the sputtering method in a manner similar to the second embodiment.

Thereafter, second barrier metal layers 8a and 8b, a second pad 9a and a second wiring 9b are formed by RIE etching. A P-SiN layer 10 is formed over the second pad 9a and second wiring 9b by a CVD method. An opening 12 is defined in the P-SiN layer 10 so as to open a slow concave surface of the second pad 9a.

As described above, the semiconductor device manufactured by the manufacturing method shown in the third embodiment can bring about the following effect in addition to the effect of the second embodiment. Namely, since the third barrier metal layer 14a remains in the pad opening 4a in the executing process of tungsten CMP, the thickness of the tungsten layer 6a in the pad opening 4a can be ensured. It is thus possible to provide a semiconductor device free of the occurrence of erosion in the first pad 2a by the tungsten CMP and high in reliability and a manufacturing method thereof.

Fourth Embodiment

A fourth embodiment of the present invention will be explained below in detail with reference to the accompanying drawings. FIGS. 4a through 4g are respectively schematic cross-sectional views showing a semiconductor device in respective process steps in a method of manufacturing the semiconductor device, according to the fourth embodiment of the present invention. Incidentally, the fourth embodiment includes a relatively large first pad 2a and second pad 9a formed in a manner similar to the second embodiment.

In FIGS. 4a through 4c, process steps similar to FIGS. 2a through 2c of the aforementioned second embodiment are performed.

Thereafter, as shown in FIG. 4d, a third barrier metal layer 14 is formed over a tungsten layer 6 by a sputtering method. Here, the third barrier metal layer 14 is laminated within a pad opening 4a along its concave shape.

Further, a BARC layer (Bottom Anti-Reflection Coating) is applied onto the third barrier metal layer 14 as an anti-reflection film layer. Here, the BARC layer is laminated within the pad opening 4a in planar form without extending along its concave shape. Other BARC layer is subjected to ashing by an $O_2$ plasma so that only the BARC layer 15 remains in the pad opening 4a.

Next, as shown in the same FIG. 4e, the third barrier metal layer 14 other than that in the pad opening 4a is removed by etching with the BARC layer 15 left in the pad opening 4a as a mask. Further, the BARC layer 15 left in the pad opening 4a is subjected to ashing. Thus, the third barrier metal layer 14a is left in the pad opening 4a.

Next, as shown in the same FIG. 4f, tungsten layers 6a and 6b and first barrier metal layers 5a and 5b lying within the pad opening 4a and a via hole 4b are left behind, and other tungsten layer 6 and first barrier metal layer 5 and part of an oxide film layer 3 are removed by tungsten CMP.

At this time, the tungsten layer 6a left in the pad opening 4a is polished in slow concave form under the influence of the third barrier metal layer 14a left in the pad opening 4a in a manner similar to the third embodiment.

Finally, as shown in the same FIG. 4g, a second barrier metal layer and a second Al layer are successively formed over the oxide film layer 3 by the sputtering method in a manner similar to the second embodiment.

Thereafter, second barrier metal layers 8a and 8b, a second pad 9a and a second wiring 9b are formed by RIE etching. A P-SiN layer 10 is formed over the second pad 9a and second wiring 9b by a CVD method. An opening 12 is defined in the P-SiN layer 10 so as to open a slow concave surface of the second pad 9a.

As described above, the semiconductor device manufactured by the manufacturing method shown in the fourth embodiment can bring about the following effect in addition to the effect of the second embodiment. Namely, since the tungsten CMP is performed in a state in which the third barrier metal 14a is formed in the pad opening 4a, the thickness of the tungsten layer 6a in the pad opening 4a can be ensured. It is thus possible to provide a semiconductor device free of the occurrence of erosion in the first pad 2a by the tungsten CMP and high in reliability and a manufacturing method thereof.

Incidentally, while the BARC layer is applied onto the third barrier metal layer 14 in the fourth embodiment, an effect similar to the fourth embodiment can be brought about even if a resist film is applied thereon in place of the BARC layer. In either case, however, it is applied onto the third barrier metal layer 14 with an extremely thin film so as not to cause variations in rate by etching.

Fifth Embodiment

A fifth embodiment of the present invention will be explained below in detail with reference to the accompanying drawings. FIGS. 5a through 5g are respectively schematic cross-sectional views showing a semiconductor device in respective process steps in a method of manufacturing the semiconductor device, according to the fifth embodiment of the present invention. Incidentally, the fifth embodiment includes a relatively large first pad 2a and second pad 9a formed in a manner similar to the second embodiment.

In FIGS. 5a through 5c, process steps similar to FIGS. 2a through 2c of the aforementioned second embodiment are performed.

Thereafter, as shown in FIG. 5d, a plasma oxide film layer 16 is formed over a tungsten layer 6 by a CVD method. Here, the plasma oxide layer 16 is laminated within a pad opening 4a along its concave shape.

Next, as shown in the same FIG. 5e, the plasma oxide film layer 16 other than that in the pad opening 4a is polished by oxide film CMP. Thus, the plasma oxide film layer 16a is left in the pad opening 4a.

Here, the oxide film CMP is so-called high planarization CMP in which polishing is performed using oxide film slurry while managing polishing pressure.

Next, as shown in the same FIG. 5f, the plasma oxide film layer 16 in the pad opening 4a is left and the tungsten layer 6 other than that in the pad opening 4a is removed by tungsten CMP. This takes place due to the difference in rate that the rate (the amount of polishing per unit time) of tungsten is about 3000 Å/min, whereas the rate of a plasma oxide film is about 100 Å/min.

Further, the tungsten CMP is carried out until an oxide film layer 3 is exposed. Thereafter, HF etching is performed to remove the plasma oxide film layer 16 corresponding to a nonconductor, which remains in the pad opening 4a. Thus, a tungsten layer 6a and a first barrier metal 5a remains in the pad opening 4a.

Finally, as shown in the same FIG. 5g, a second barrier metal layer and a second Al layer are successively formed over the oxide film layer 3 by a sputtering method in a manner similar to the second embodiment.

Thereafter, second barrier metal layers 8a and 8b, a second pad 9a and a second wiring 9b are formed by RIE etching. A P-SiN layer 10 is formed over the second pad 9a and second wiring 9b by the CVD method. An opening 12 is defined in the P-SiN layer 10 so as to open a slow concave surface of the second pad 9a.

As described above, the semiconductor device manufactured by the manufacturing method shown in the fifth embodiment can bring about the following effect in addition to the effect of the second embodiment. Namely, since the tungsten CMP is performed in a state in which the plasma oxide film layer 16a is formed in the pad opening 4a, the thickness of the tungsten layer 6a in the pad opening 4a can be ensured. It is thus possible to provide a semiconductor device free of the occurrence of erosion in the first pad 2a by the tungsten CMP and high in reliability and a manufacturing method thereof.

Sixth Embodiment

A sixth embodiment of the present invention will be explained below in detail with reference to the accompanying drawings. FIGS. 6a through 6g are respectively schematic cross-sectional views showing a semiconductor device in respective process steps in a method of manufacturing the semiconductor device, according to the sixth embodiment of the present invention. Incidentally, the sixth embodiment includes a relatively large first pad 2a and second pad 9a formed in a manner similar to the second embodiment.

In FIGS. 6a through 6c, process steps similar to FIGS. 2a through 2c of the aforementioned second embodiment are performed.

Thereafter, as shown in FIG. 6d, a third barrier metal layer 14 is formed on a tungsten layer 6 by a sputtering method. A second tungsten layer 17 is formed over the third barrier metal layer 14 by a CVD method. Further, a fourth barrier metal layer 18 is formed over the second tungsten layer 17 by the sputtering method. Thus, a laminated structure of a barrier metal and tungsten is formed.

Here, any of the third barrier metal layer 14, the second tungsten layer 17 and the fourth barrier metal layer 18 is laminated within a pad opening 4a so as to extend along its concave form.

Next, as shown in the same FIG. 6e, tungsten CMP is carried out. In its process, the fourth barrier metal layer 18 and the second tungsten layer 17 other than that in the pad opening 4a are removed so as to expose the tungsten layer 6.

Further, as shown in the same FIG. 6f, the tungsten CMP is used to leave tungsten layers 6a and 6b and first barrier metal layers 5a and 5b in the pad opening 4a and a via hole 4b, and to remove the tungsten layer 6 and the first barrier metal layer 5 other than those so as to expose an oxide film layer 3.

Finally, as shown in the same FIG. 6g, a second barrier metal layer and a second Al layer are successively formed over the oxide film layer 3 by the spurring method in a manner similar to the second embodiment.

Thereafter, second barrier metal layers 8a and 8b, a second pad 9a and a second wiring 9b are formed by RIE etching. A P-SiN layer 10 is formed over the second pad 9a and second wiring 9b by the CVD method. An opening 12 is defined in the P-SiN layer 10 so as to open a slow concave surface of the second pad 9a.

As described above, the effect of the third embodiment is promoted in the semiconductor device manufactured by the manufacturing method shown in the sixth embodiment. Namely, the manufacturing method of the semiconductor device, according to the sixth embodiment is one wherein in the manufacturing method according to the third embodiment, the second tungsten layer 17 and the fourth barrier metal layer 18 are further repeatedly laminated on one another and the thickness of the tungsten layer 6a in the pad opening 4a can further be ensured to perform tungsten CMP. It is thus possible to provide a semiconductor device free of the occurrence of erosion in the first pad 2a by tungsten CMP and high in reliability, and a manufacturing method thereof.

Incidentally, the manufacturing method of the semiconductor device, according to the sixth embodiment is additionally provided with a step for laminating the second tungsten layer 17 and the fourth barrier metal layer 18 on each other in addition to the laminating step in the third embodiment. However, this step may be repeated to further laminate a tungsten layer and a barrier metal layer on each other.

Seventh Embodiment

A seventh embodiment of the present invention will be explained below in detail with reference to the accompanying drawings. FIGS. 7a through 7f are respectively schematic cross-sectional views showing a semiconductor device in respective process steps in a method of manufacturing the semiconductor device, according to the seventh embodiment of the present invention. Incidentally, the seventh embodiment includes a relatively large first pad 2a and second pad 9a formed in a manner similar to the second embodiment.

Figure 7A:
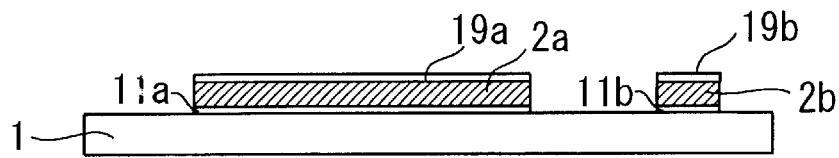
FIG. 7 is a schematic cross-sectional view showing a semiconductor device in respective process steps of a method of manufacturing the semiconductor device, showing a seventh embodiment of the present invention.

As shown in FIG. 7a, a lower barrier metal layer is first formed over a base substrate 1 by a sputtering method. A first Al layer is formed over the lower barrier metal layer by the sputtering method. Further, a stopper layer is formed over the first Al layer. Here, the stopper layer is formed of TiN/Ti or TiO/Ti, for example.

Further, RIE etching is done to form a first pad 2a and a first wiring 2b, and lower barrier metal layers 11a and 11b and stopper layers 19a and 19b corresponding to them.

Figure 7B:
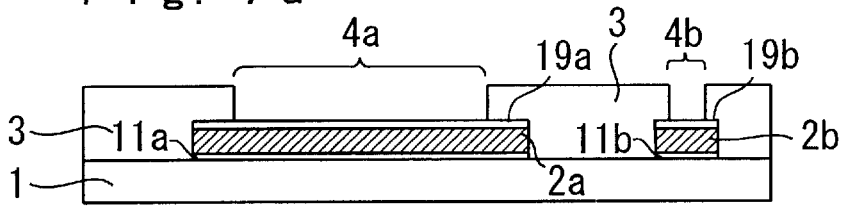

Next, as shown in the same FIG. 7b, an oxide film layer 3 is formed over the stopper layers 19a and 19b and subjected to photoengraving and RIE etching. Thus, a pad opening 4a is defined in the surface of the first pad 2a, and a via hole 4b is defined in the surface of the first wiring 2b.

Figure 7C:
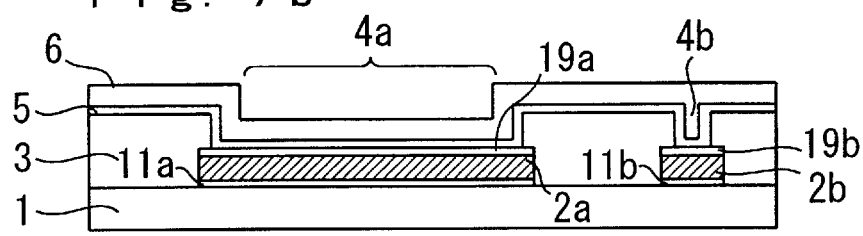

Next, as shown in the same FIG. 7c, a first barrier metal layer 5 is formed over the oxide film layer 3 by the sputtering method. Further, a tungsten layer 6 is formed over the first barrier metal layer 5 by a CVD method.

Figure 7D:
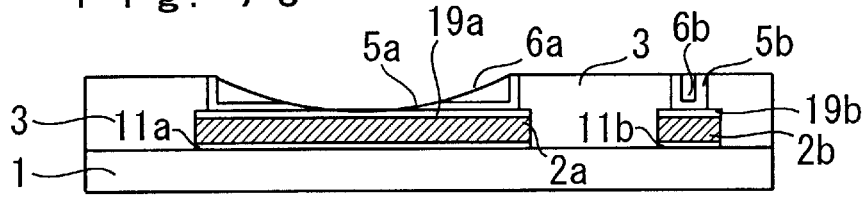

Next, as shown in the same FIG. 7d, tungsten layers 6a and 6b and first barrier metal layers 5a and 5b are respectively left in the pad opening 4a and the via hole 4b. Other tungsten layer 6 and first barrier metal 5, and part of the oxide film layer 3 are removed by tungsten CMP.

Figure 7E:
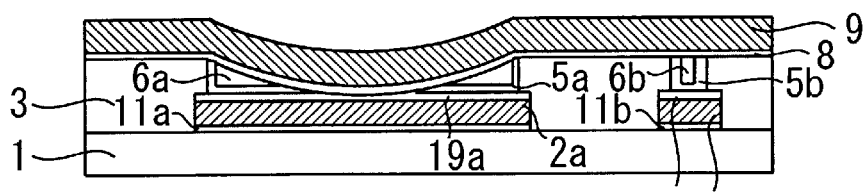

Next, as shown in the same FIG. 7e, a second barrier metal layer 8 and a second Al layer 9 are successively formed over the oxide film layer 3 by the sputtering method.

Figure 7F:
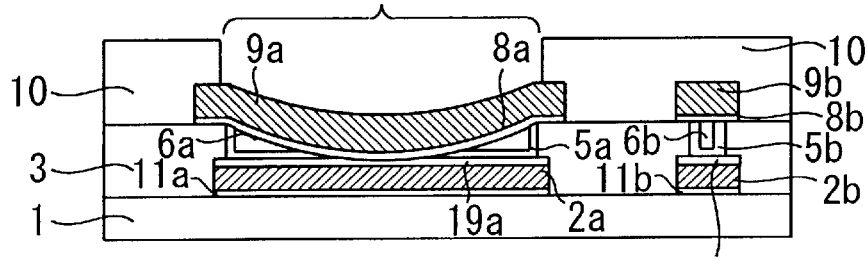
Figure 8A:
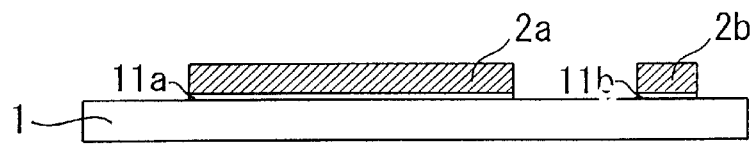
FIG. 8 is a schematic cross-sectional view showing a semiconductor device in respective process steps of a conventional semiconductor device manufacturing method.
Figure 8B:
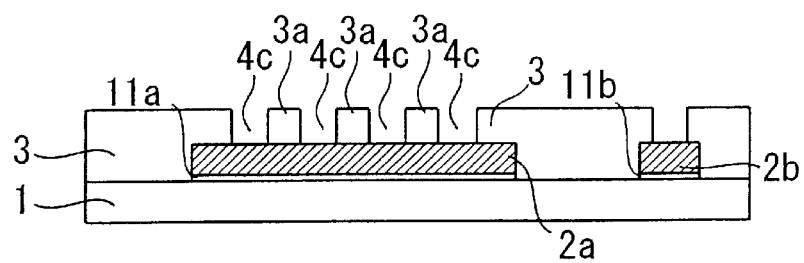
Figure 8C:
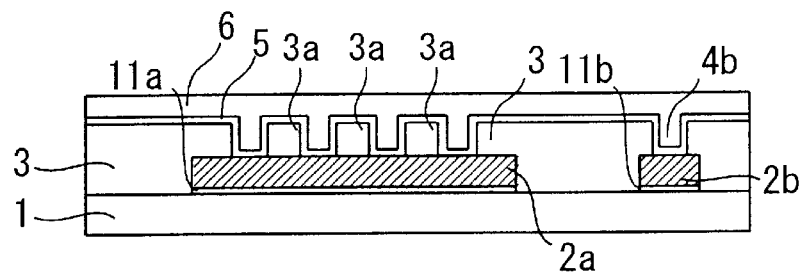
Figure 8D:
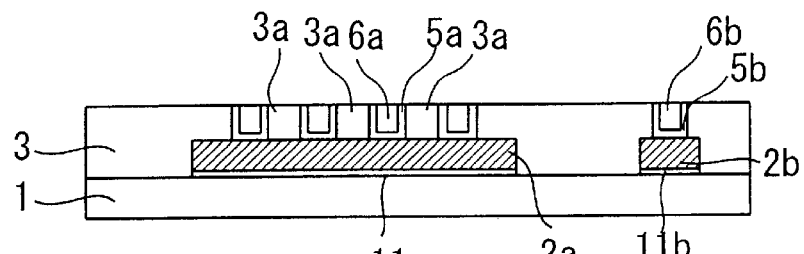
Figure 8E:
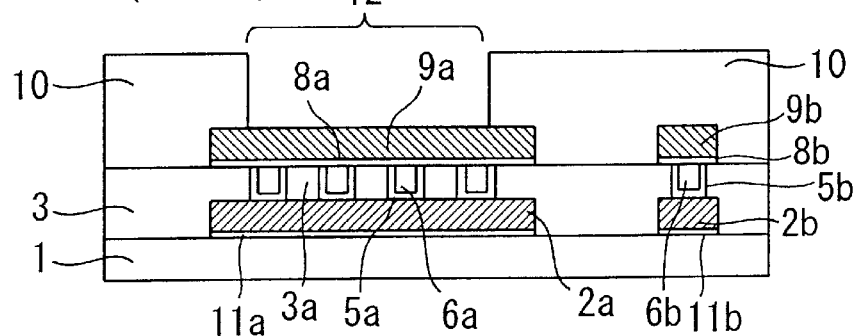

Finally, as shown in the same FIG. 7f, second barrier metal layers 8a and 8b, a second pad 9a and a second wiring 9b are formed by RIE etching. A P-SiN layer 10 is formed over the second pad 9a and the second wiring 9b by the CVD method. Further, an opening 12 is defined in the P-SiN layer 10 so as to open the surface of the second pad 9a.

As described above, the semiconductor device manufactured by the manufacturing method shown in the seventh embodiment can bring about the following effect in addition to the effect of the second embodiment. Namely, since the stopper layer 19a is laminated on the first pad 2a, the stopper layer 19a could stem the progress of polishing by tungsten CMP. It is thus possible to provide a semiconductor device free of the occurrence of erosion in the first pad 2a by tungsten CMP and high in reliability, and a manufacturing method thereof.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-126648, filed on Apr. 24, 2001 including specification, claims, drawings and summary, on which the Convention priority of the present application is based, are incorporated herein by reference in its entirety.

What is claimed is:

1. A method of manufacturing a semiconductor device, the method comprising the steps of:

forming a first pad over a base substrate;

forming an insulating film layer over the first pad;

defining a concave pad opening in the insulating film layer so as to expose substantially all of the surface of the first pad;

forming a first barrier metal layer over the first pad and the insulating film layer so as to extend along the concave shape of the pad opening;

forming a plug layer over the first barrier metal layer;

performing chemical mechanical polishing on the plug layer and the first barrier metal layer to thereby expose the insulating film layer retaining at least a portion of the plug layer in the pad opening;

forming a second barrier metal layer over the plug layer and insulating film layer exposed by said chemical mechanical polishing step; and forming a second pad over the second barrier metal layer, wherein said second pad is a bonding pad having an exposed portion of sufficient area to permit wire bonding.

2. The method of manufacturing a semiconductor device according to claim 1, wherein said pad opening is a single opening having no insulating film layer within a region thereof.

3. A method of manufacturing a semiconductor device, the method comprising the steps of:

forming a first pad over a base substrate;

forming a stopper layer over the first pad;

forming an insulating film layer over the first pad and stopper layer;

defining a concave pad opening in the insulating film layer so as to expose substantially all of the stopper layer on the surface of the first pad;

forming a first barrier metal layer over the stopper layer and the insulating film layer so as to extend along the concave shape of the pad opening;

forming a plug layer over the first barrier metal layer;

performing chemical mechanical polishing on the plug layer and the first barrier metal layer to thereby expose the insulating film layer retaining at least a portion of the plug layer in the pad opening, said portion of the plug layer defining a concave upper surface;

forming a second barrier metal layer over the plug layer and insulating film layer exposed by said chemical mechanical polishing step; and forming a second pad over the second barrier metal layer, wherein the concavity of said concave upper surface of said plug layer is at least substantially imparted to said second barrier metal layer and said second pad.

4. The method of manufacturing a semiconductor device according to claim 3, wherein said stopper layer is formed of TiN/Ti or TiO/Ti.

5. The method of manufacturing a semiconductor device according to claim 1, wherein said step for performing said CMP to thereby expose the insulating film layer and leave the plug layer in the pad opening is a step for leaving the plug layer within a region for the pad opening in concave form.

6. The method of manufacturing a semiconductor device according to claim 1, further including, after said step for forming the plug layer over the first barrier metal layer, a step for forming a third barrier metal layer over the plug layer, and a step for CMP-polishing the third barrier metal layer to thereby expose the plug layer and leave the third barrier metal layer in the pad opening.

7. The method of manufacturing a semiconductor device according to claim 6, wherein said step for forming the plug layer over the first barrier metal layer and thereafter forming the third barrier metal layer over the plug layer is repeated plural times to repeatedly laminate a barrier metal layer and a plug layer.

8. The method of manufacturing a semiconductor device according to claim 1, further including, after said step for forming the plug layer over the first barrier metal layer, a step for forming a third barrier metal layer over the plug layer, a step for forming an anti-reflection film layer over the third barrier metal layer, a step for plasma-processing the anti-reflection film layer to thereby leave the anti-reflection film layer only in the pad opening, a step for etching the third barrier metal layer with the anti-reflection film layer left in the pad opening as a mask to thereby expose the plug layer and leave the anti-reflection film layer and the third barrier metal layer in the pad opening, and a step for removing the anti-reflection film layer left in the pad opening.

9. The method of manufacturing a semiconductor device according claim 1, further including, after said step for forming the plug layer over the first barrier metal layer, a step for forming a plasma oxide film layer over the plug layer, and a step for effecting the oxide film CMP on the plasma oxide film layer to thereby expose the plug layer and leave the plasma oxide film layer in the pad opening, and further including a step for removing the plasma oxide film layer left in the pad opening by etching after said step for performing said CMP to thereby expose the insulating film layer and leave the plug layer in the pad opening.

10. The method of manufacturing a semiconductor device according to claim 9, wherein said step for performing said oxide film CMP to thereby expose the plug layer and leave the plasma oxide film layer in the pad opening is a step for performing polishing while controlling polishing pressure through the use of an oxide film slurry.

11. The method of manufacturing a semiconductor device according to claim 1, wherein the plug layer is formed of tungsten.

12. The method of manufacturing a semiconductor device according to claim 1, wherein the first pad or second pad is formed of Al.

13. The method of manufacturing a semiconductor device according to claim 1, wherein said step for forming the second pad over the first pad is repeated plural times to thereby laminate a plurality of pads over the first pad.

14. A semiconductor device manufactured by the method according to claim 1.

* * * * *